United States Patent
Nakayama

(10) Patent No.: US 6,940,144 B2
(45) Date of Patent: Sep. 6, 2005

(54) SEMICONDUCTOR EQUIPMENT

(75) Inventor: Yoshiaki Nakayama, Okazaki (JP)

(73) Assignee: Denso Corporation, Kariya (JP)

( * ) Notice: Subject to any disclaimer, the term of this patent is extended or adjusted under 35 U.S.C. 154(b) by 155 days.

(21) Appl. No.: 10/662,370

(22) Filed: Sep. 16, 2003

(65) Prior Publication Data

US 2004/0061163 A1 Apr. 1, 2004

(30) Foreign Application Priority Data

Sep. 19, 2002 (JP) .................................. 2002-273117
Aug. 29, 2003 (JP) .................................. 2003-307286

(51) Int. Cl.$^7$ ............................................. H01L 29/00
(52) U.S. Cl. .................. 257/502; 257/302; 257/135; 257/220; 438/242; 438/137
(58) Field of Search ................................ 257/503, 302, 257/135, 220, 347, 506, 508, 773; 438/242, 137, 138, 173, 309, 421, 459, 977

(56) References Cited

U.S. PATENT DOCUMENTS 5,332,920 A * 7/1994 Nakagawa et al. ......... 257/501
5,841,197 A 11/1998 Adamic, Jr.
6,084,284 A 7/2000 Adamic, Jr.
6,124,179 A 9/2000 Adamic, Jr.
6,365,932 B1 * 4/2002 Kouno et al. ............... 257/341

FOREIGN PATENT DOCUMENTS

JP A-5-198758 8/1993

* cited by examiner

Primary Examiner—David Nelms
Assistant Examiner—Long Tran
(74) Attorney, Agent, or Firm—Posz Law Group, PLC

(57) ABSTRACT

Semiconductor equipment includes a semiconductor substrate with a semiconductor layer embedded therein and a vertical type transistor. The substrate has a principal side, a rear side opposite to the principal side, and a trench disposed in the rear side of the substrate. The vertical type transistor has a first electrode disposed in the principal side of the substrate, a second electrode disposed in the rear side, and a diffusion region disposed in the principal side. The first electrode connects to the diffusion region through an interlayer insulation film. The second electrode is disposed in the trench and connects to the semiconductor layer exposed in the trench. This vertical transistor has a low ON-state resistance.

27 Claims, 14 Drawing Sheets

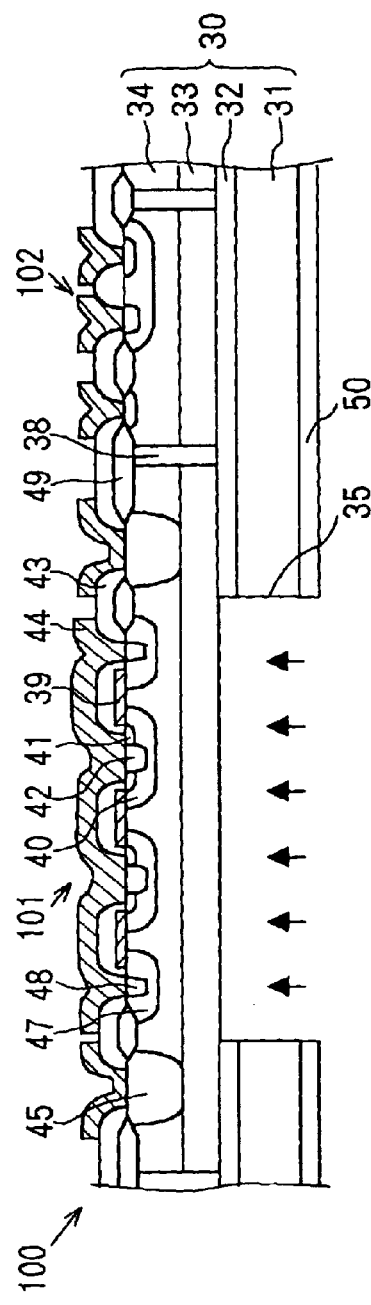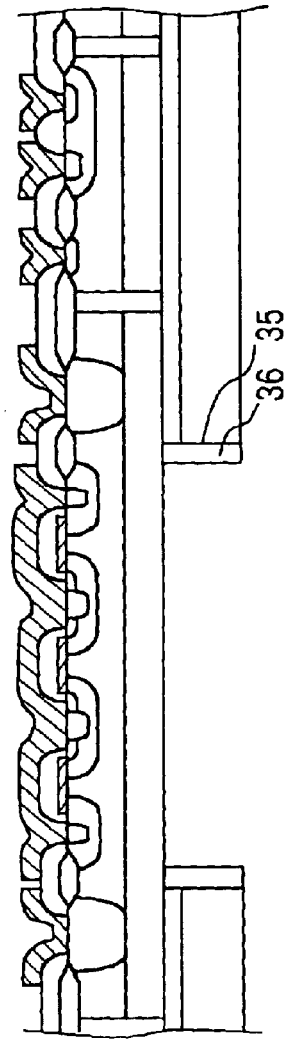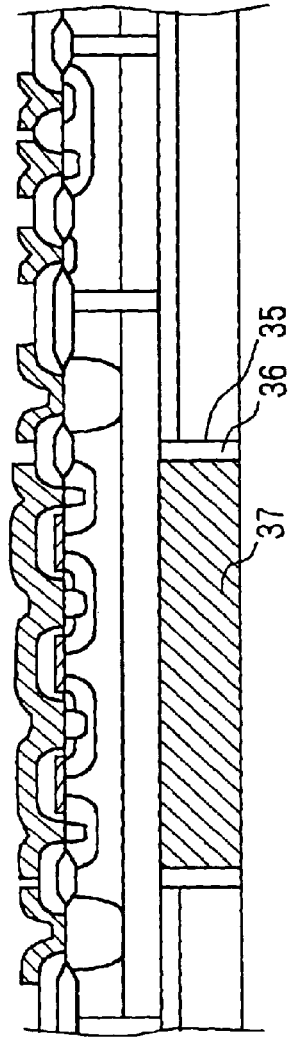
FIG. 2A
FIG. 2B
FIG. 2C

SEMICONDUCTOR EQUIPMENT

CROSS REFERENCE TO RELATED APPLICATION

This application is based on Japanese Patent Applications No. 2002-273117 filed on Sep. 19, 2002, and No. 2003-307286 filed on Aug. 29, 2003, the disclosures of which are incorporated herein by reference.

FIELD OF THE INVENTION

The present invention relates to semiconductor equipment, specifically, the present invention relates to semiconductor equipment having a low ON-state resistance transistor.

BACKGROUND OF THE INVENTION

Semiconductor equipment 200 having a metal oxide semiconductor transistor (i.e., a MOS transistor) according to a prior art is disclosed in Japanese Patent No. 3257057-B2 (Japanese Unexamined Patent Application Publication No. H05-198758). As shown in FIG. 14, the semiconductor equipment 200 includes a semiconductor substrate 3. An insulation layer 4 having a box shape (i.e., a box type insulation layer) is disposed in the substrate 3. The insulation layer 4 has three openings for opening upside of the substrate 3. Each opening is divided by a vertical wall of the insulation layer 4, and accommodates a control unit 5 and two MOS field effect transistors (two MOSFETS) 2A, 2B. The control unit 5 provides a logic circuit or a gate drive circuit.

Each MOSFET 2A, 2B is disposed on the right or left side of the control unit 5, respectively, and is a lateral double-diffused MOSFET (i.e., a L-DMOS). Each L-DMOS 2A, 2B includes a source 21, a drain 22, and a gate 23. The source 21 and the drain 22 are separated in a horizontal direction, and are formed with an impurity diffusion method. Specifically, the source 21 of each L-DMOS 2A, 2B is formed by a double diffusion method, which provides to diffuse from the surface of the substrate 3, and the source 21 is grounded.

A vertical double-diffused MOSFET (i.e., a V-DMOS) 1A, 1B is disposed on both sides of the box type insulation layer 4, i.e., each V-DMOS 1A, 2B is disposed on right or left side of the insulation layer 4, respectively. Each V-DMOS 1A, 1B includes a source 11, a drain 12, and a gate 13. The source 11 is formed by the double diffusion method, which provides to diffuse from the surface of the substrate 3. Both V-DMOS 1A, 1B have the common drain 12, which is disposed on a rear side of the substrate 3 and connects to an electric power source B.

To form the box type insulation layer 4 in the semiconductor equipment 200, it is necessary to form a silicon on insulator structure (i.e., an SOI structure) selectively, as described above. Therefore, the manufacturing cost of the semiconductor equipment 200 becomes higher. Moreover, the drain 12 of the V-DMOS 1A, 1B is common, so that degree of freedom for designing a multi-channel switch formed by a plurality of V-DMOSs becomes lower.

It is considered that an SOI substrate embedding an insulation film therein is used as the substrate 4 so as to lower the manufacturing cost of the semiconductor equipment 200 and to increase the degree of freedom for designing. In this case, an $N^+$ type semiconductor layer as the drain 12 is formed on the insulation layer in the SOI substrate. A resistance of the $N^+$ type semiconductor layer in the V-DMOS becomes a rate-determining factor, so that it is difficult to reduce an ON-state resistance of the V-DMOS.

SUMMARY OF THE INVENTION

In view of the above problem, it is an object of the present invention to provide semiconductor equipment having a low ON-state resistance transistor. Further, it is another object of the present invention to provide semiconductor equipment having highly degree of freedom for forming a multi-channel switch.

Semiconductor equipment includes a semiconductor substrate with a semiconductor layer embedded therein and a vertical type transistor. The substrate has a principal side, a rear side opposite to the principal side, and a trench disposed in the rear side of the substrate. The vertical type transistor has a first electrode disposed in the principal side of the substrate, a second electrode disposed in the rear side, and a diffusion region disposed in the principal side. The first electrode connects to the diffusion region through an interlayer insulation film. The second electrode is disposed in the trench and connects to the semiconductor layer exposed in the trench. Preferably, the first electrode includes a first metal layer, and the second electrode includes a second metal layer.

In the above equipment, the trench is disposed in the rear side of the substrate, and the second metal layer embedded in the trench provides the second electrode. Therefore, a current path between the first and second electrodes becomes short, so that the resistance between the first and second electrodes is reduced. Thus, an ON-state resistance between the first and second electrodes is also decreased, i.e., the vertical transistor has a low ON-state resistance.

Preferably, the trench has a taper shape. In this case, the second metal layer disposed in the trench radiates heat generated in the vertical transistor effectively. Moreover, since the trench can be formed by a wet etching method, a manufacturing cost of the semiconductor equipment is reduced.

Preferably, the trench is filled with the second metal layer. In this case, the second metal layer disposed in the trench radiates heat generated in the vertical transistor effectively. Moreover, the resistance of the second electrode is decreased.

Preferably, the vertical type transistor is a metal oxide semiconductor transistor, and the first electrode provides a source electrode of the metal oxide semiconductor transistor, and the second electrode provides a drain electrode of the metal oxide semiconductor transistor. In this case, an ON-state resistance between the source and the drain of the MOS transistor is decreased.

Preferably, the semiconductor substrate includes a first semiconductor layer having a first conductive type and a second semiconductor layer having the first conductive type, the second semiconductor layer being disposed on the first semiconductor layer and having a low dope concentration lower than that of the first semiconductor layer. Further, the trench reaches the first semiconductor layer, and the metal oxide semiconductor transistor includes a drain provided by the first semiconductor layer, a channel diffusion region having a second conductive type and disposed on a surface portion of the second semiconductor layer, a source diffusion region having the first conductive type and disposed on a surface portion of the channel diffusion region, and a gate electrode contacting a part of the channel diffusion region through a gate insulation film. In this case, the resistance of the first semiconductor layer is reduced, so that an ON-state resistance between the source and the drain is decreased.

Preferably, the semiconductor substrate includes a silicon on insulator substrate having an insulation film embedded therein. The fist and second semiconductor layers are disposed on the principal side with respect to the insulation film. The trench penetrates the insulation film and reaches the first semiconductor layer. In this case, the second metal layer contacts the first semiconductor layer exposed in the trench. Accordingly, the resistance of the first semiconductor layer as the drain is reduced, so that the ON-state resistance between the source and the drain is decreased.

Preferably, the metal oxide semiconductor transistor further includes a drain connection diffusion region having the first conductive type. The drain connection diffusion region is disposed from a principal side surface of the second semiconductor layer to the first semiconductor layer so as to contact the first semiconductor layer. In this case, a drain current flowing through the MOS transistor can be monitored.

Preferably, the gate electrode penetrates the channel diffusion region, and reaches the second semiconductor layer. In this case, the current path between the source and the drain becomes short, so that the ON-state resistance between the source and the drain is further decreased.

Preferably, the vertical type transistor is an insulated gate bipolar transistor. The first electrode provides an emitter electrode of the insulated gate bipolar transistor, and the second electrode provides a collector electrode of the insulated gate bipolar transistor. In this case, an ON-state resistance between the emitter and the collector is decreased.

Preferably, the vertical type transistor is a bipolar transistor. The first electrode provides an emitter electrode of the bipolar transistor, and the second electrode provides a collector electrode of the bipolar transistor. In this case, an ON-state resistance between the emitter and the collector is decreased.

Preferably, the semiconductor substrate further includes a separator for surrounding a main part of the vertical type transistor. The separator reaches the insulation film so that the main part of the vertical type transistor is isolated from surroundings by the separator. In this case, the vertical transistor is limited to be affected by other device disposed around the vertical transistor.

Preferably, the trench has a sidewall covered with a sidewall insulation film. The second metal layer disposed in the trench is isolated from surroundings by the sidewall insulation film. In this case, the vertical transistor is limited to be affected by other device disposed around the vertical transistor.

Preferably, the semiconductor equipment is mounted on a printed circuit board by a flip chip mounting method in such a manner that the principal side with respect to the insulation film faces the printed circuit board. In this case, heat generated in the vertical transistor radiates through the second metal layer effectively, so that heat radiation of the semiconductor equipment is improved.

Preferably, the second metal layer is connected to a heat sink with solder. In this case, the heat generated in the vertical transistor radiates through the second metal layer to the heat sink effectively, so that heat radiation of the semiconductor equipment is further improved.

Preferably, the semiconductor equipment is mounted in a multi-layer printed circuit board in such a manner that the semiconductor equipment is embedded in the multi-layer printed circuit board. The semiconductor equipment can be mounted compactly.

Preferably, the vertical type transistor includes a plurality of transistors for providing a multi-channel switch. In this case, the multi-channel switch has a low ON-state resistance.

Preferably, the multi-channel switch further includes an electric load impedance. A plurality of transistors and the electric load impedance are disposed between a power source and a ground for providing a high side switch, in which the vertical type transistor is disposed on a power source side and the electric load impedance is disposed on a ground side. In this case, the multi-channel high side switch has a low ON-state resistance.

Further, semiconductor equipment includes a semiconductor substrate, and a metal oxide semiconductor transistor disposed on the semiconductor substrate. The semiconductor substrate includes a first semiconductor layer and a second semiconductor layer. The first semiconductor layer has a first conductive type for providing a drain of the metal oxide semiconductor transistor. The second semiconductor layer has the first conductive type, is disposed on the first semiconductor layer, and has a low dope density lower than that of the first semiconductor layer. The metal oxide semiconductor transistor includes a channel diffusion region, a source diffusion region, and a gate electrode. The channel diffusion region has a second conductive type, and is disposed on a surface portion of the second semiconductor layer. The source diffusion region has the first conductive type, and is disposed on a surface portion of the channel diffusion region. The gate electrode contacts a part of the channel diffusion region through a gate insulation film. The first semiconductor layer includes a trench disposed from a surface of the first semiconductor layer to the second semiconductor layer, and a metal layer as an electrode disposed in the trench.

In the above equipment, a current path between the first semiconductor layer and the source diffusion region becomes short, so that the resistance between them is reduced. Thus, an ON-state resistance between them is also decreased, i.e., the MOS transistor has a low ON-state resistance.

Furthermore, semiconductor equipment includes a semiconductor substrate provided by a silicon on insulator substrate having an insulation film embedded therein, and a metal oxide semiconductor transistor disposed on the semiconductor substrate. The semiconductor substrate includes a first semiconductor layer and a second semiconductor layer, which are disposed on a principal side of the substrate with respect to the insulation film. The first semiconductor layer has a first conductive type for providing a drain of the metal oxide semiconductor transistor. The second semiconductor layer has the first conductive type, is disposed on the first semiconductor layer, and has a low dope density lower than that of the first semiconductor layer. The metal oxide semiconductor transistor includes a channel diffusion region, a source diffusion region, and a gate electrode. The channel diffusion region has a second conductive type, and is disposed on a surface portion of the second semiconductor layer. The source diffusion region has the first conductive type, and is disposed on a surface portion of the channel diffusion region. The gate electrode contacts a part of the channel diffusion region through a gate insulation film. The semiconductor substrate further includes a trench and a metal layer. The trench is disposed on a rear side of the substrate opposite to the principal side, is disposed from a rear surface of the substrate, penetrates the insulation film, and reaches the first semiconductor layer. The metal layer as an electrode is disposed in the trench and contacts the first semiconductor layer.

In the above equipment, a current path between the first semiconductor layer and the source diffusion region becomes short, so that the resistance between them is reduced. Thus, an ON-state resistance between them is also decreased, i.e., the MOS transistor has a low ON-state resistance.

BRIEF DESCRIPTION OF THE DRAWINGS

The above and other objects, features and advantages of the present invention will become more apparent from the following detailed description made with reference to the accompanying drawings. In the drawings:

FIGS. 2A to 2c are cross-sectional views explaining a manufacturing method of the semiconductor equipment according to the first embodiment;

DETAILED DESCRIPTION OF THE PREFERRED EMBODIMENTS (First Embodiment)

Figure 1:
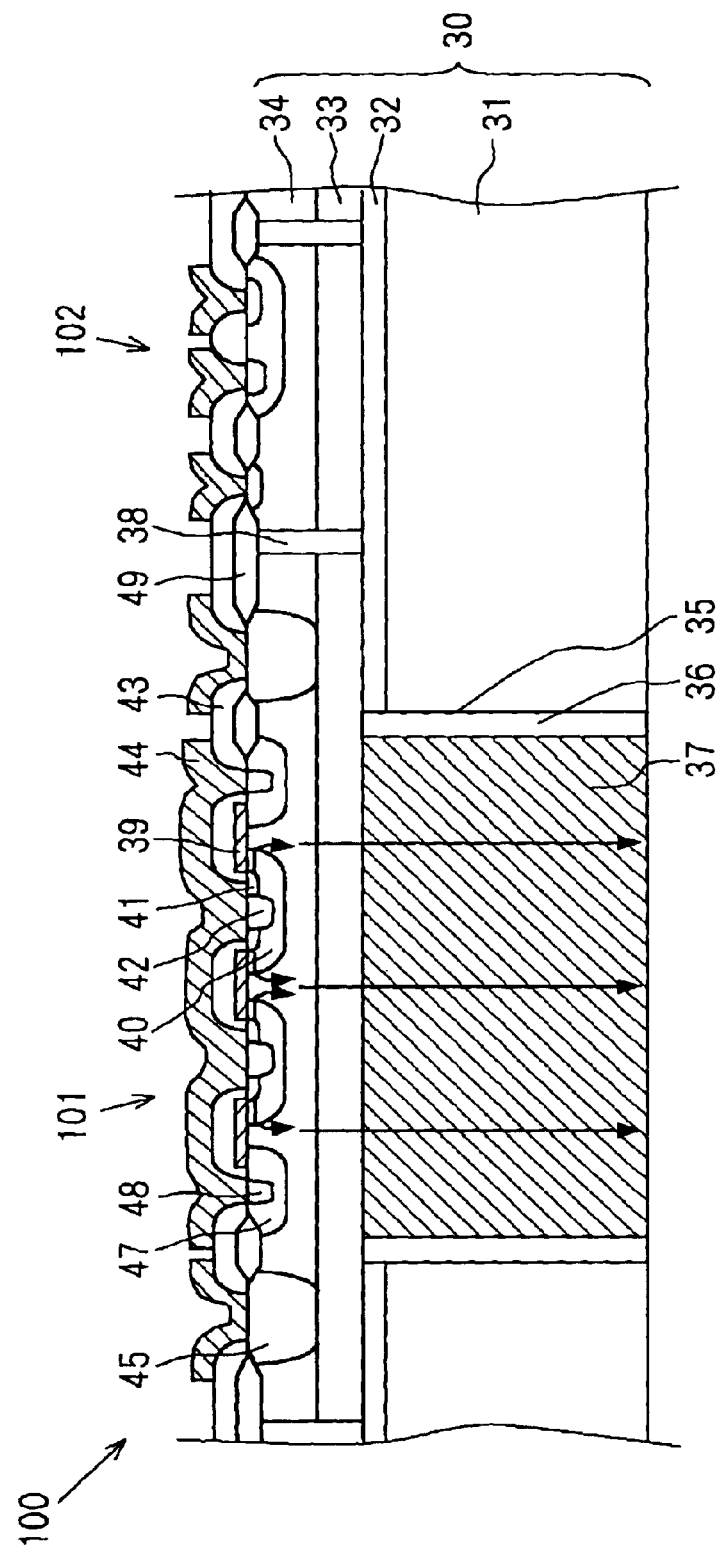
FIG. 1 is a schematic cross-sectional view showing semiconductor equipment according to a first embodiment of the present invention.

Semiconductor equipment 100 according to a first embodiment of the present invention is shown in FIG. 1. The semiconductor equipment 100 includes a vertical type MOS transistor 101 and a lateral type bipolar transistor 102 formed on a semiconductor substrate 30. The substrate 30 is an SOI substrate (i.e., a silicon on insulator substrate) embedding an insulation film 32 therein. The insulation film 32, an $N^+$ type first semiconductor layer 33, and an N type second semiconductor layer 34 are formed on a silicon substrate (i.e., a Si substrate) 31 in this order. The first semiconductor layer 33 is an $N^+$ type semiconductor, and the second semiconductor layer 34 is an N type semiconductor, a dope density of which is lower than that of the $N^+$ type semiconductor.

A P type diffusion layer 40 is formed on a surface portion of the second semiconductor layer 34. Further, an $N^+$ type diffusion layer 41 and a $P^+$ type diffusion layer 42 are formed on a surface portion of the diffusion layer 40. Outside of the diffusion region 40 in a horizontal direction, a P type diffusion region 47 and a $P^+$ type diffusion region 48 are disposed. Further, outside of the P type diffusion region 47 in the horizontal direction, an $N^+$ type diffusion region 45 is disposed. The bottom of the $N^+$ type diffusion region 45 reaches the first semiconductor layer 33.

In the MOS transistor 101, the first semiconductor layer 33 corresponds to a drain, the P type diffusion region 40 to a channel, and the $N^+$ type diffusion region 41 to a source. Here, the first semiconductor layer 33 is the $N^+$ type semiconductor and disposed on a principal side of the substrate 30, i.e., the first semiconductor layer 33 is disposed on the principal side with respect to the insulation film 32. Here, both the P type diffusion region 47 and the $P^+$ type diffusion region 48 disposed outside of the diffusion region 40 in the horizontal direction relieve an electric field outside the diffusion region 40, so that the withstand voltage of the MOS transistor 101 is limited to decrease.

A gate electrode 39 is disposed on the principal side with respect to the insulation film 32, and contacts a part of the diffusion region 40 through an insulation film (not shown). The diffusion regions 41, 42, 48 disposed on the surface of the substrate 30 are connected mutually to an electrode 44 through an interlayer insulation film 43. In this case, the electrode 44 provides a source electrode. The $N^+$ type diffusion region 45 disposed between the surface of the substrate 30 and the first semiconductor layer 33 connects to the drain, i.e., the first semiconductor layer 33 so that it performs to monitor the current of the MOS transistor 101. Therefore, the diffusion region 45 can be omitted from the semiconductor equipment 100.

On the rear side of the substrate 30, which is opposite to the principal side and disposed under the insulation film 33, a trench 35 is disposed such that the trench 35 is disposed perpendicular to the surface, penetrates the insulation film 32, and reaches the first semiconductor layer 33. On a sidewall of the trench 35, a sidewall insulation film 36 is formed. A metal layer 37 as a drain electrode is embedded in the trench 35 through the sidewall insulation film 36 so that the metal layer 37 contacts the first semiconductor layer 33, which exposes from the silicon substrate 31 by the trench 35.

The MOS transistor 101 disposed on the principal side with respect to the insulation film 32 is isolated and separated from surroundings by a separator 38. Also, the metal layer 37 disposed on the rear side of the insulation film 32 is isolated and separated from surroundings by the sidewall insulation film 36 formed on the sidewall of the trench 35. A local oxidation of silicon (i.e., a LOCOS) region 49 is disposed on the separator 38.

Next, manufacturing process for manufacturing the semiconductor equipment 100 is described as follows.

At first, an SOI wafer as the semiconductor substrate 30 is prepared, as shown in FIG. 2A. The separator 38, the MOS transistor 101, and the bipolar transistor 102 are formed on the principal side with respect to the insulation film 32, so that the principal side of the semiconductor substrate 30 is accomplished.

Then, the rear surface of the substrate 30 is polished so that the thickness of the silicon substrate 31 becomes a predetermined thickness. After that, an oxide film 50 is deposited on the rear surface of the substrate 30 by chemical vapor deposition (i.e., CVD) method. The oxide film 50 is processed and patterned such that a part of the oxide film 50 disposed under the diffusion region 40 and the P type diffusion region 47 is removed so as to expose the silicon substrate 31. Then, the silicon substrate 31 and the insulation film 32 are etched using the patterned oxide film 50 as a mask by an anisotropic dry-etching method. Thus, the first semiconductor layer 33 is exposed from the oxide film 50, and the trench 35 is formed on the rear side of the substrate 30.

As shown in FIG. 2B, after the oxide film 50 is removed, another oxide film (not shown) is deposited on the rear surface of the substrate 30 by the CVD method. Then, a part of the oxide film is etched by the anisotropic dry-etching method in such a manner that the oxide film disposed on the sidewall of the trench 35 as the sidewall insulation film 36 is left only. Thus, the sidewall insulation film 36 is formed on the sidewall of the trench 35.

As shown in FIG. 2C, after metallic material is formed on the rear side of the substrate 30 by a copper plating method and the like so as to fill the metallic material as the metal layer 37 in the trench 35, the metallic material on the rear side is polished until the silicon substrate 31 is exposed on the rear surface. Thus, the metal layer 37 is embedded in the trench 35 through the sidewall insulation film 36. The semiconductor equipment 100 is accomplished.

Figure 14:
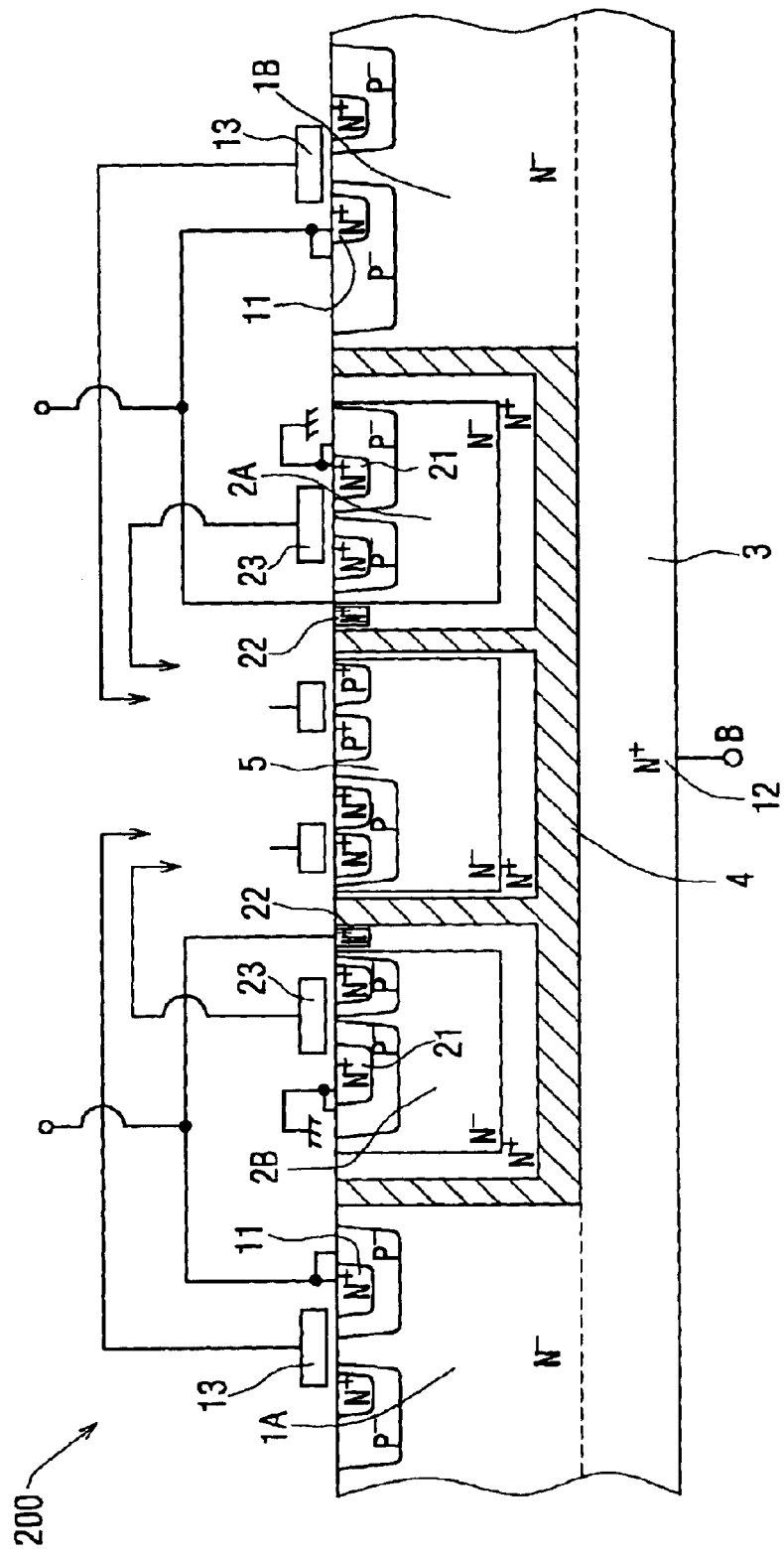
FIG. 14 is a schematic cross-sectional view showing semiconductor equipment according to a prior art.

In the semiconductor equipment 200 shown in FIG. 14, the SOI structure is formed selectively in the $N^+$ type semiconductor substrate 3, so that the V-DMOS 1A, 1B and the L-DMOS 2A, 2B as a power device are formed. However, the semiconductor equipment 100 according to the first embodiment shown in FIG. 1 is manufactured by using the SOI substrate 30, in which the insulation film 32 is embedded. Therefore, the semiconductor equipment 100 is manufactured easily compared with the semiconductor equipment 200 shown in FIG. 14, so that the manufacturing cost of the semiconductor equipment 100 is reduced.

Moreover, the MOS transistor 101 is separated and isolated from surroundings by the insulation film 32, the separator 38 disposed on the insulation film 32, and the sidewall insulation film 36 disposed under the insulation film 32. Therefore, it is easy to form a multi-channel switch by using a plurality of isolated MOS transistors. Thus, degree of freedom for forming the multi-channel switch is increased.

As shown as arrows in FIG. 1, electrons are outputted from the $N^+$ type diffusion region 41 as a source, pass through the diffusion region 40 and the first semiconductor layer 33 as a drain, and are collected to the metal layer 37 as a drain electrode. In the MOS transistor 101, the $N^+$ type first semiconductor layer 33 formed on the insulation film 32 in the SOI substrate 30 corresponds to the $N^+$ semiconductor substrate 3 of the semiconductor equipment 200 shown in FIG. 14. The thickness of the first semiconductor layer 33 shown in FIG. 1 is much thinner than that of the $N^+$ semiconductor substrate 3 shown in FIG. 14.

Moreover, in the MOS transistor 101, the trench 35 is formed so as to penetrate the insulation film 32 and to reach the first semiconductor layer 33. Also the metal layer 37 is embedded in the trench 35, and contacts the first semiconductor layer 33 exposed in the trench 35. Therefore, current path between the source and the drain, i.e., current path between the $N^+$ diffusion region 41 and the first semiconductor layer 33 becomes short, so that the drain resistance of the MOS transistor 101 (i.e., the resistance between the source and the drain) is much reduced, which is much smaller than that of the V-DMOS 1A, 1B shown in FIG. 14. Thus, the ON-state resistance of the MOS transistor 101 is also reduced compared with that of the V-DMOS 1A, 1B shown in FIG. 14.

(Second Embodiment)

Figure 3:
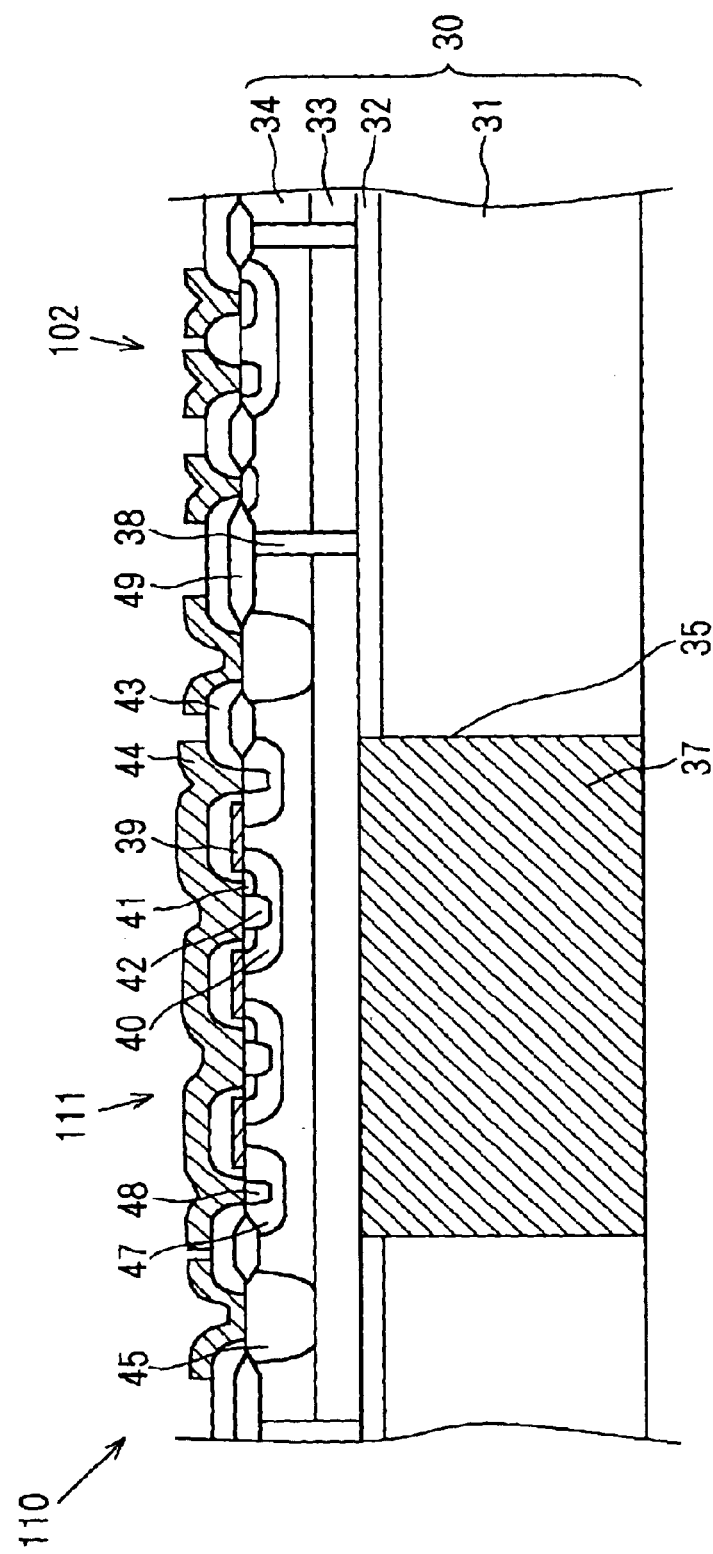
FIG. 3 is a schematic cross-sectional view showing semiconductor equipment according to a second embodiment of the present invention.
Figure 4:
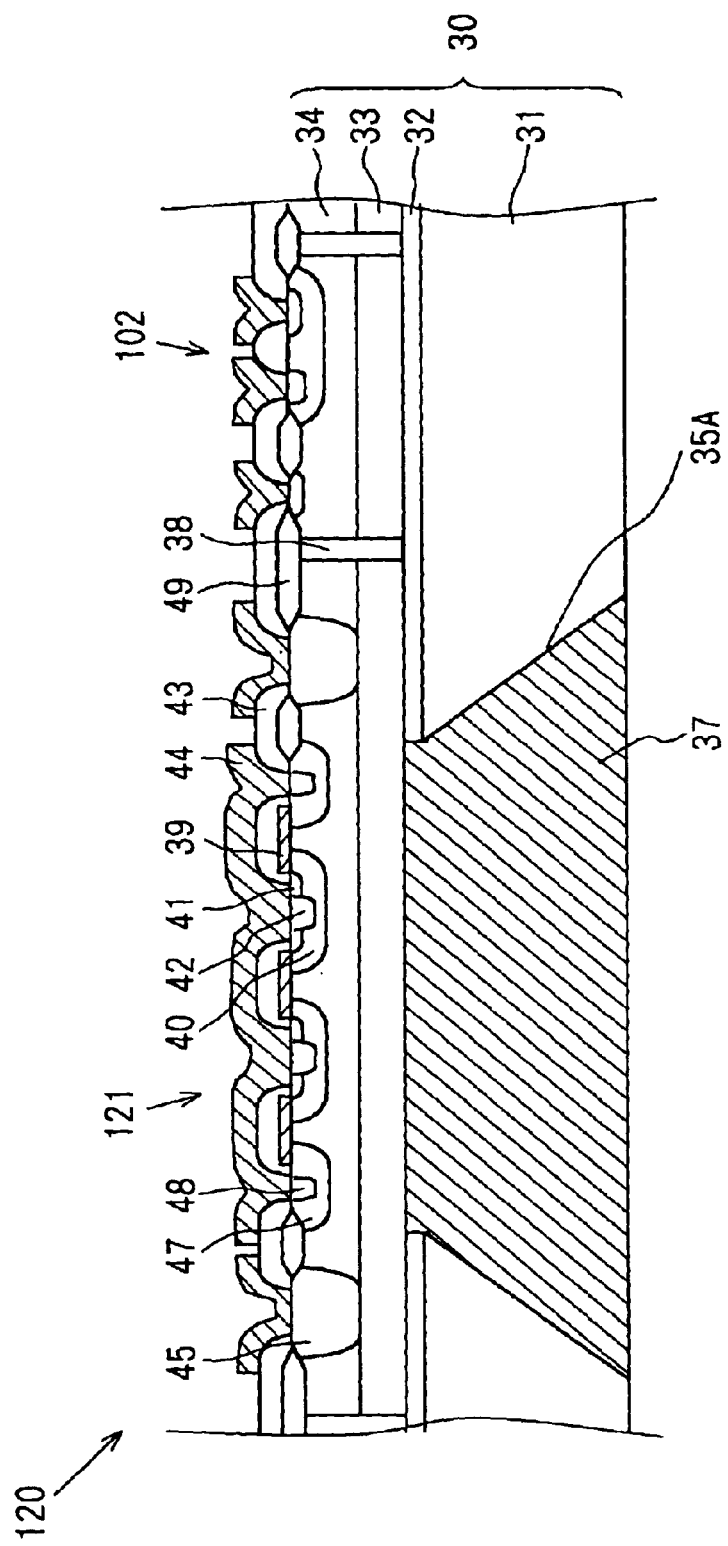
FIG. 4 is a schematic cross-sectional view showing semiconductor equipment according to a modification of the second embodiment of the present invention.
Figure 5:
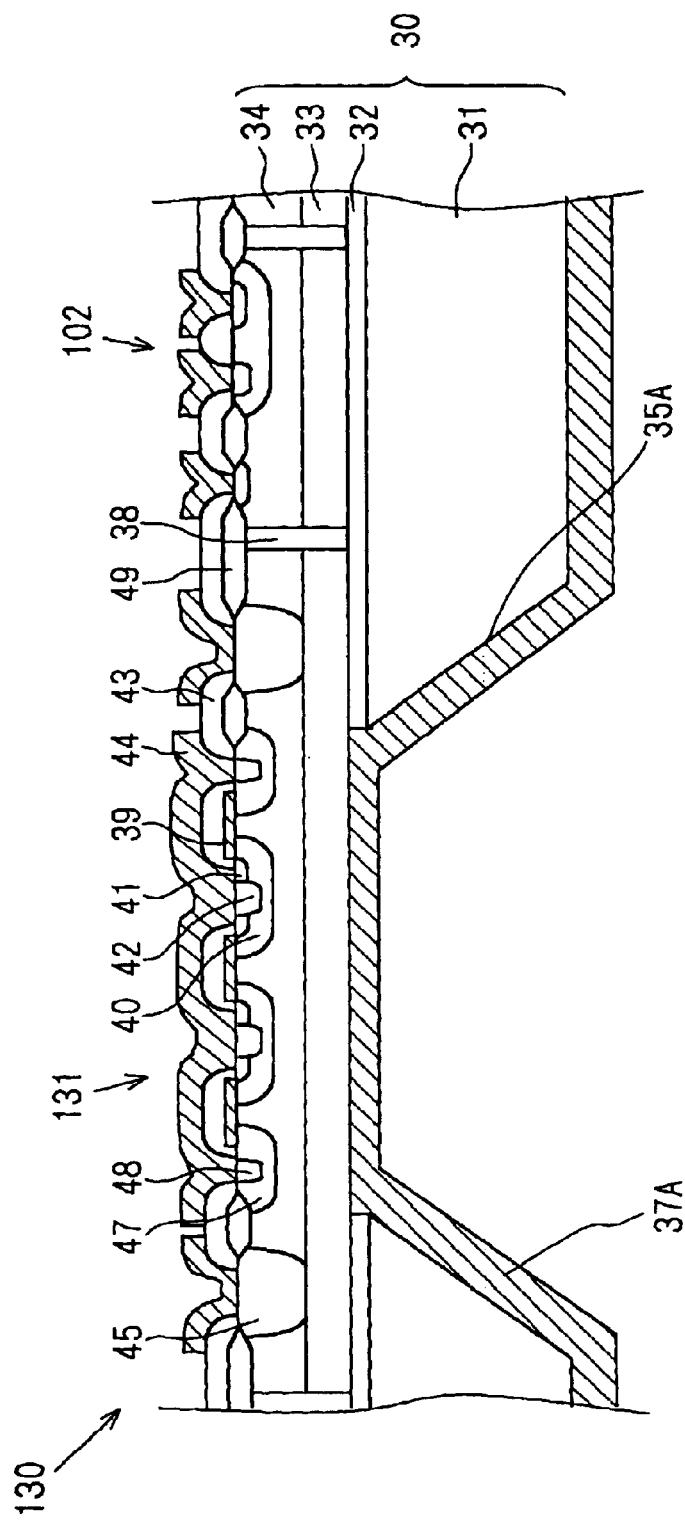
FIG. 5 is a schematic cross-sectional view showing semiconductor equipment according to another modification of the second embodiment of the present invention.

Three semiconductor equipments 110, 120, 130 according to a second embodiment of the present embodiment are shown in FIGS. 3–5, respectively.

In a vertical type MOS transistor 111 of the semiconductor equipment 110 shown in FIG. 3, the trench 35 is formed on the rear side of the substrate 30, and disposed under the insulation film 32. The trench 35 is disposed perpendicularly to the surface of the substrate 30. Comparing with the semiconductor equipment 100 shown in FIG. 1, no sidewall insulation film is formed on the sidewall of the trench 35 shown in FIG. 3, so that the metal layer 37 embedded in the trench 35 is not isolated and separated from surroundings.

When only one MOS transistor 111 is formed on the substrate 30, or when a plurality of vertical type MOS transistors 111 having the same drain potential is formed on the substrate 30, the semiconductor equipment 110 having no sidewall insulation film can be used for them. In this case, the forming process for forming the sidewall insulation film is omitted, so that the manufacturing process of the semiconductor equipment 110 is simplified. Thus, the manufacturing cost of the semiconductor equipment 110 is reduced.

In a MOS transistor 121 of the semiconductor equipment 120 shown in FIG. 4, a trench 35A is formed on the rear side of the substrate 30 such that the trench has a taper shape. The trench 35A is disposed under the insulation film 32 in the substrate 30. The trench 35A having a taper shape is formed by using alkali etching method. Therefore, the etching process for forming the trench 35A is simplified compared with the dry-etching method, so that the manufacturing cost of the semiconductor equipment 120 is decreased.

In a MOS transistor 131 of the semiconductor equipment 130 shown in FIG. 5, the trench 35A is formed on the rear side of the substrate 30 such that the trench has a taper shape. A metal layer 37A in the trench 35A is a metallic thin film, so that the metal layer 37A covers the sidewall of the trench 35A. Therefore, the metal layer 37A is not embedded in the trench, i.e., the metal layer 37A does not fill the trench completely.

The metal layer 37A is made of, for example, a multi-layer film of titanium/nickel/gold formed by a sputtering method, or a copper film formed by a plating method. When the trench 35A is too deep to embed the metal layer 35 in the trench 35A, the metal layer 37A composing the metallic thin film is usable for the semiconductor equipment 130 instead of the metal layer 37 embedded in the trench 35A shown in FIG. 4.

(Third Embodiment)

Figure 6:
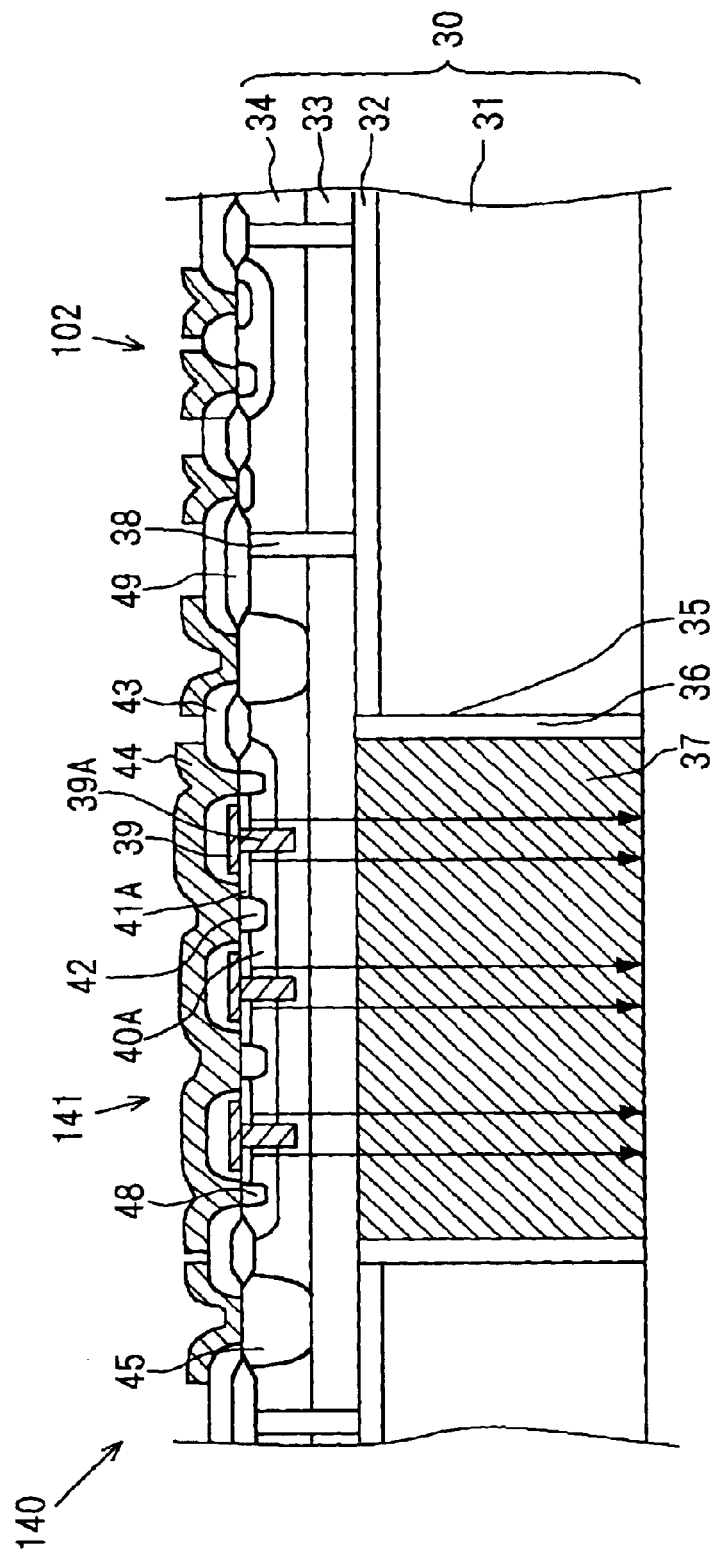
FIG. 6 is a schematic cross-sectional view showing semiconductor equipment according to a third embodiment of the present invention.

Semiconductor equipment 140 according to a third embodiment of the present invention is shown in FIG. 6. In a vertical type MOS transistor 141 of the semiconductor equipment 140, a P type diffusion region 40A is disposed on the surface portion of the second semiconductor layer 34. Further, an $N^+$ type diffusion region 41A is disposed on the surface portion of the diffusion region 40A. A gate electrode 39A penetrates the diffusion region 40A, and reaches the second semiconductor layer 34. The gate electrode 39A contacts the diffusion regions 40A, 41A and the second semiconductor layer 34 through a gate insulation film (not shown).

As shown as arrows in FIG. 6, electrons are outputted from the diffusion region 41A as a source, pass through the diffusion region 40A as a channel and the first semiconductor layer 33 as a drain straightly, and are collected into the metal layer 37. Therefore, the current path between the source and the drain becomes short compared with that of the MOS transistor 101 shown in FIG. 1, so that the drain resistance of the MOS transistor 141 (i.e., the resistance between the source and the drain) is much reduced. Thus, the ON-state resistance of the MOS transistor 141 is also reduced.

(Fourth Embodiment)

Figure 7A:
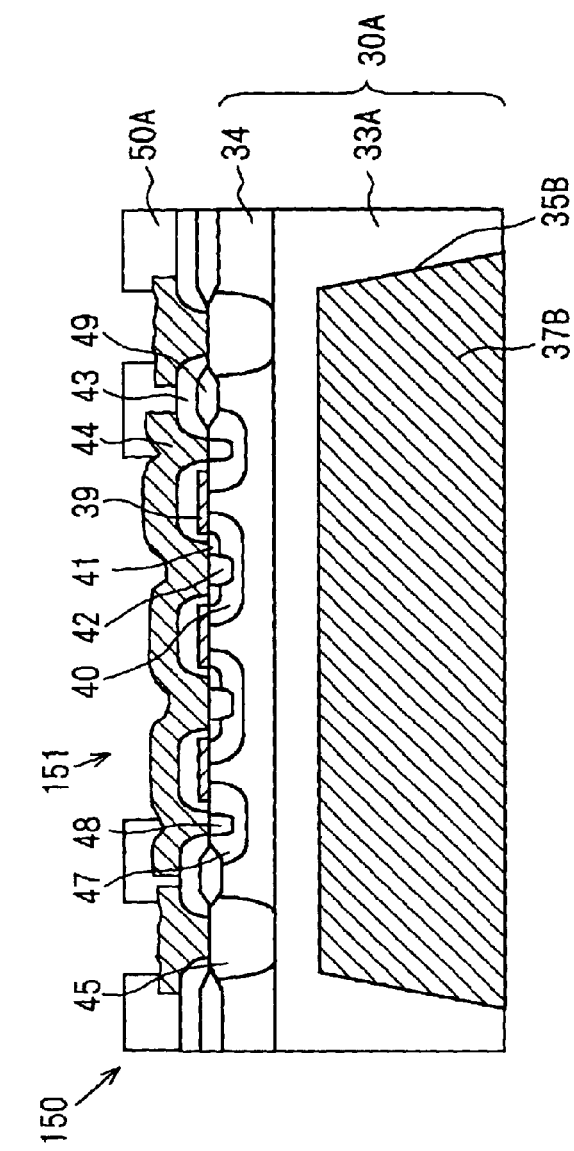
FIG. 7A is a schematic cross-sectional view showing semiconductor equipment according to a fourth embodiment of the present invention.
Figure 7B:
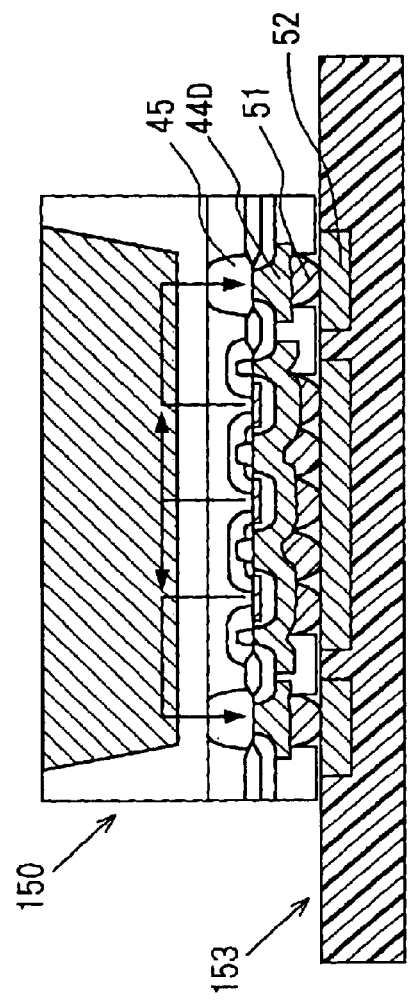
FIG. 7B is a schematic cross-sectional view explaining a mounting configuration of the semiconductor equipment mounted on a printed circuit board, according to the fourth embodiment.

Semiconductor equipment 150 according to a fourth embodiment of the present invention is shown in FIGS. 7A and 7B. FIG. 7A is a schematic cross-sectional view showing the semiconductor equipment 150, and FIG. 7B is a schematic cross-sectional view explaining a mounting configuration of the semiconductor equipment 150 mounted on a printed circuit board 153.

In the semiconductor equipment 150, only one vertical type MOS transistor 151 is formed on a semiconductor substrate 30A, which includes the first semiconductor layer 33A and the second semiconductor layer 34. Therefore, the semiconductor equipment 150 provides a discrete device. A trench 35B is disposed in the first semiconductor layer 33A, and a metal layer 37B is embedded in the trench 35B. The first semiconductor layer 33A is used as a support substrate. Here, a passivation film 50A is disposed on the surface of the substrate 30A for protecting the semiconductor equipment 150.

As shown in FIG. 7B, the semiconductor equipment 150 as a discrete device is mounted on the printed circuit board 153 by using flip chip mounting method. In other words, the semiconductor equipment 150 is reversed, and the electrode 44 of the semiconductor equipment 150 and a solder land 52 of the printed circuit board 153 are connected with a solder ball 51. That is, the principal side of the substrate 30A faces the printed circuit board 153.

The metal layer 37B dose not connect to a printed circuit on the board 153. Therefore, in the MOS transistor 151 of the semiconductor equipment 150, electrons moves along with arrows shown in FIG. 7B. In this case, the metal layer 37B does not work as a drain electrode. Instead of the metal layer 37B, an electrode 44D connected to the $N^+$ type diffusion region 45 works as a drain electrode.

The trench 35B is formed in the first semiconductor layer 33A, and the metal layer 37B is formed in the trench 35B.

Therefore, the resistance of the first semiconductor layer 33A as a drain is reduced, so that the ON-state resistance of the MOS transistor 151 is decreased. Further, heat generated in the MOS transistor 151 is radiated through the metal layer 37B. Therefore, heat radiation of the semiconductor equipment 150 is improved.

Here, the metal layer 37B can attach to a heat sink with a solder. In this case, the heat generated in the MOS transistor 151 radiates to the heat sink through the metal layer 37B, so that the heat radiation of the semiconductor equipment 150 is further improved.

(Fifth Embodiment)

Figure 8:
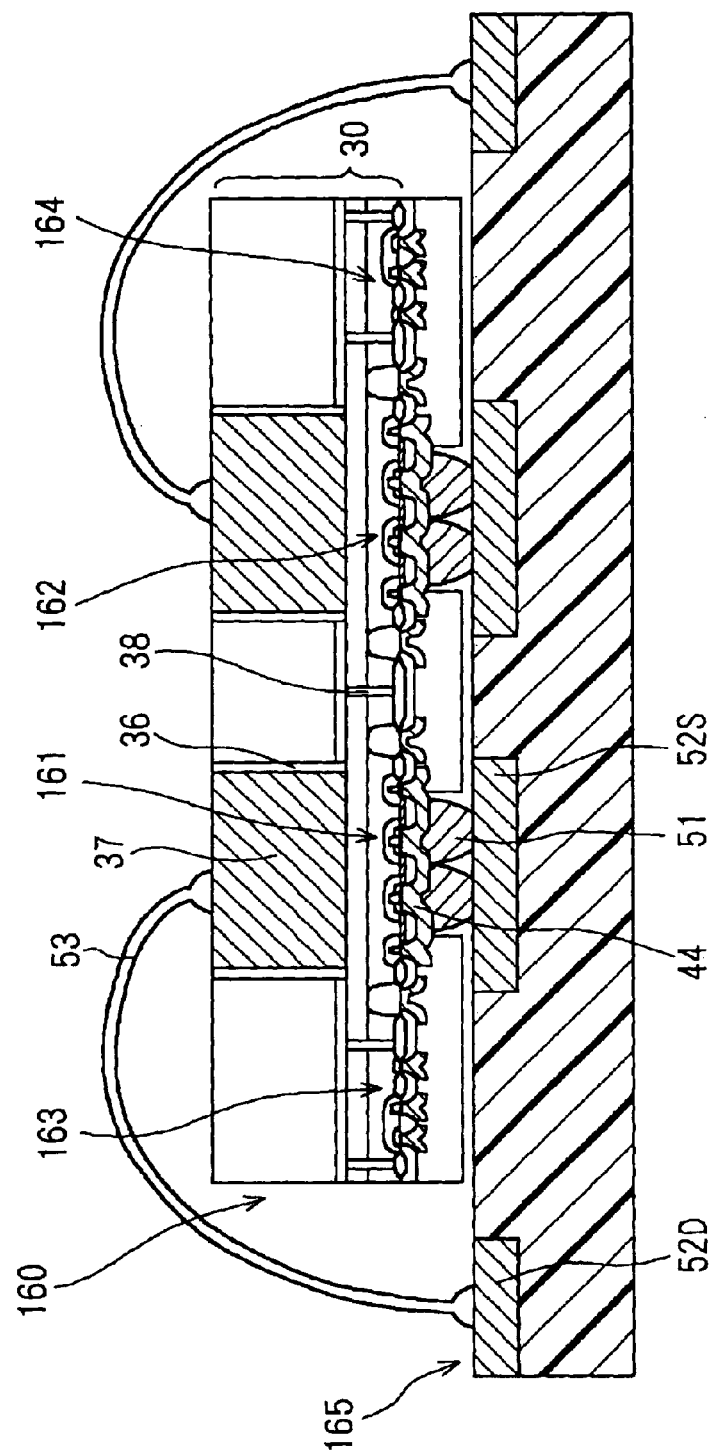
FIG. 8 is a schematic cross-sectional view explaining a mounting configuration of semiconductor equipment mounted on a printed circuit board, according to a fifth embodiment of the present invention.

Semiconductor equipment 160 according to a fifth embodiment of the present invention is shown in FIG. 8. FIG. 8 is a schematic cross-sectional view explaining a mounting configuration of the semiconductor equipment 160 mounted on a printed circuit board 165. The semiconductor equipment 160 includes two vertical type MOS transistors 161, 162, and two lateral type bipolar transistors 163, 164. Each MOS transistor 161, 162 has the same structure as the MOS transistor 101 shown in FIG. 1. Each MOS transistor 161, 162 is isolated and separated by the separator 38 disposed on the principal side of the substrate 30 and by the sidewall insulation film 36 disposed on the rear side of the substrate 30.

The semiconductor equipment 160 is mounted on the printed circuit board 165 by the flip chip mounting method. The electrode 44 of the MOS transistor 161, 162 and the solder land 52S are connected with the solder ball 51. The metal layer 37 as a drain electrode and the solder land 52D of the printed circuit board 165 are connected with a wire 53. Thus, heat generated in the MOS transistors 161, 162 is radiated through the metal layer 37B, so that the heat radiation of the semiconductor equipment 160 is improved.

Figure 9:
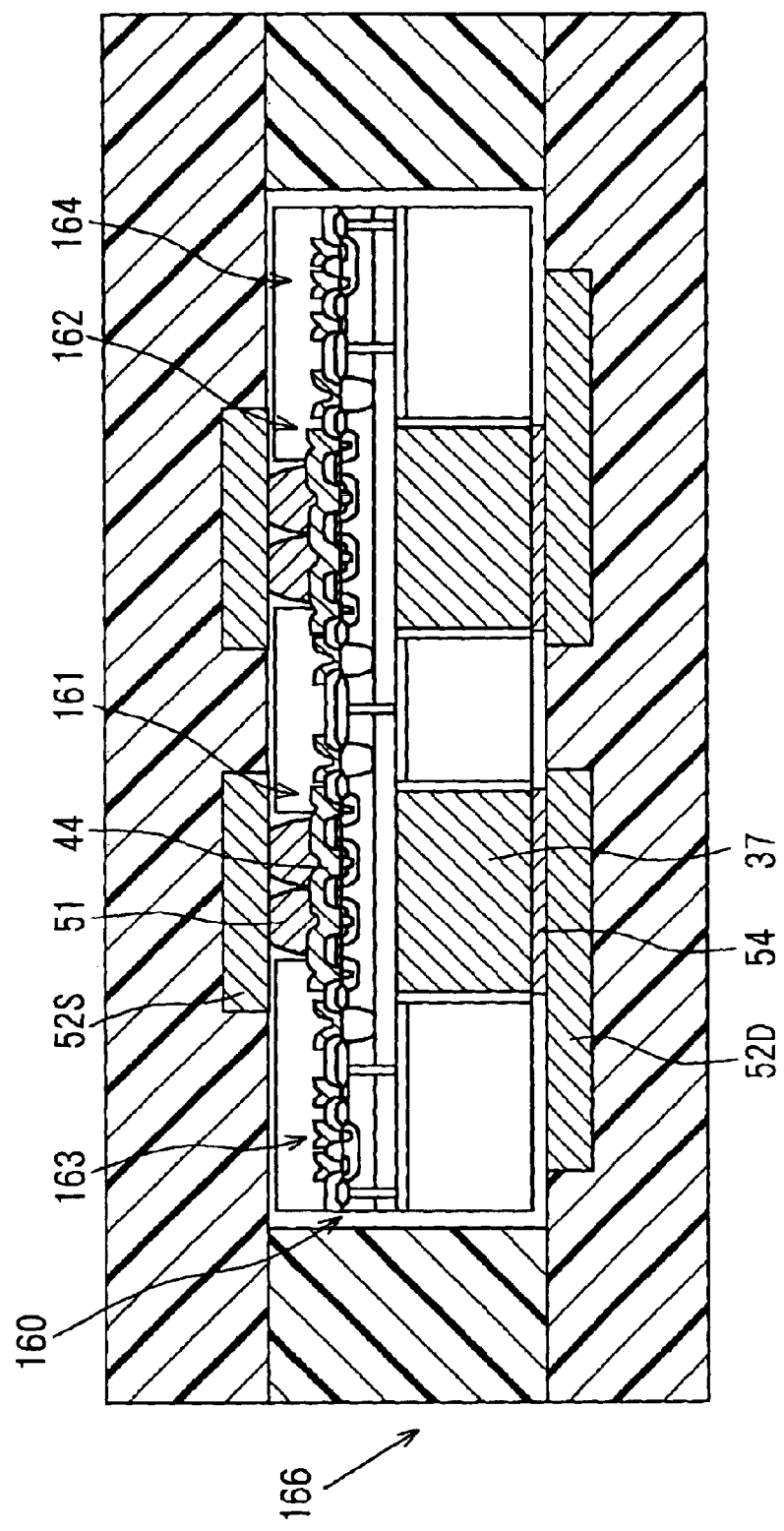
FIG. 9 is a schematic cross-sectional view explaining another mounting configuration of the semiconductor equipment mounted on a multi-layer printed circuit board, according to the fifth embodiment.

FIG. 9 is a schematic cross-sectional view explaining another mounting configuration of the semiconductor equipment 160 mounted on a multi-layer printed circuit board 166. The electrode 44 of the MOS transistor 161, 162 and the solder land 52S of the multi-layer printed circuit board 166 are connected with the solder ball 51. The metal layer 37 as a drain electrode and the solder land 52D of the multi-layer printed circuit board 166 are connected with a solder 54. Thus, the semiconductor equipment 160 can be mounted compactly, since the semiconductor equipment 160 is embedded in the multi-layer printed circuit board 166.

In the semiconductor equipment 160, each MOS transistor 161, 162 is isolated and separated each other. Therefore, by using these two MOS transistors, a low ON-state resistance multi-channel switch is formed.

(Sixth Embodiment)

Figure 10A:
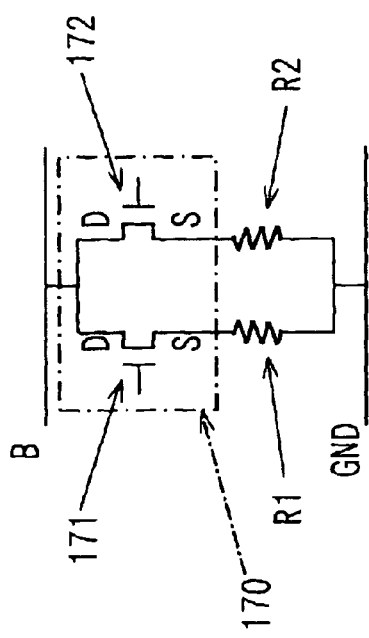
FIG. 10A is a circuit diagram explaining a high side switch of semiconductor equipment according to a sixth embodiment of the present invention.
Figure 10B:
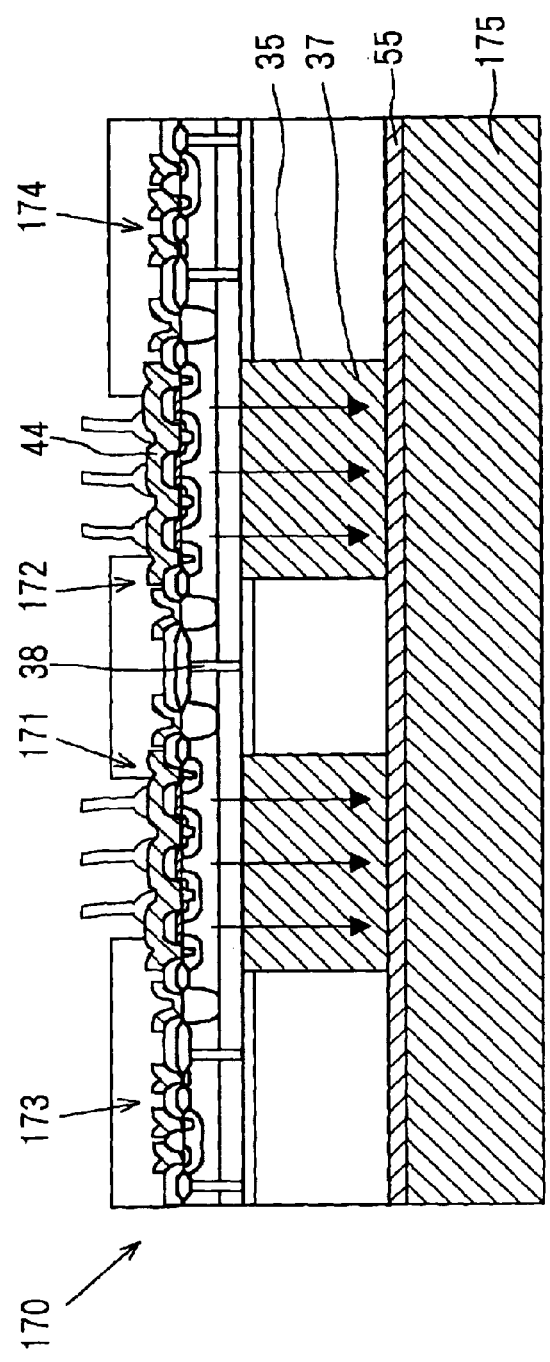
FIG. 10B is a schematic cross-sectional view explaining a mounting configuration of the semiconductor equipment as the high side switch mounted on a heat sink, according to the sixth embodiment.

Semiconductor equipment 170 according to a sixth embodiment of the present invention is shown in FIGS. 10A and 10B. FIG. 10A is a circuit diagram explaining a high side switch of the semiconductor equipment 170, and FIG. 10B is a schematic cross-sectional view explaining a mounting configuration of the semiconductor equipment 170 as the high side switch mounted on a heat sink 175.

As shown in FIG. 10A, the high side switch is provided such that vertical type MOS transistors 171, 172 and electric load impedances R1, R2 are inserted between an electric power source B and a ground GND. Specifically, the MOS transistors 171, 172 are disposed on the power source side, and the electric load impedances R1, R2 are disposed on the ground side. The semiconductor equipment 170 having two MOS transistors 171, 172 provides a dual-channel high side switch. As shown in FIG. 10A, in a multi-channel high side switch such as the dual-channel high side switch, a drain circuit D of each switch disposed on the power source side can be integrated into one drain circuit. However, a source S of each MOS transistor 171, 172 connects to the electric load impedance R1, R2, respectively.

As shown in FIG. 10B, the semiconductor equipment 170 as a dual-channel high side switch is mounted on the heat sink 175. The semiconductor equipment 170 includes two MOS transistors 171, 172 and two bipolar transistors 173, 174. Each MOS transistor 171, 172 has the same structure as the MOS transistor 111 shown in FIG. 3. Each MOS transistor 171, 172 is isolated and separated by the separator 38 disposed on the principal side of the substrate 30 in the horizontal direction. However, on the rear side of the substrate 30 in the vertical direction, no sidewall insulation film is formed on the sidewall of the trench 35. The metal layer 37 in the trench 35 is connected to the heat sink 175 with a solder 55. Therefore, in the semiconductor equipment 170, electrons are outputted from the electrode 44, pass through the metal layer 37 as a drain electrode, and flow into the heat sink 175. Since two MOS transistors 171, 172 provides the high side switch, the metal layers 37 of the MOS transistors 171, 172 as a drain electrode are connected together, so that the drain circuit D is integrated.

Thus, two MOS transistors 171, 172 work as a low ON-state resistance dual-channel high side switch. Heat generated in the two MOS transistors 171, 172 conducts through the metal layer 37, which has high thermal conductivity. Then, the heat is radiated to the heat sink 175. Therefore, thermal radiation of the semiconductor equipment 170 is improved.

(Seventh Embodiment)

Figure 11A:
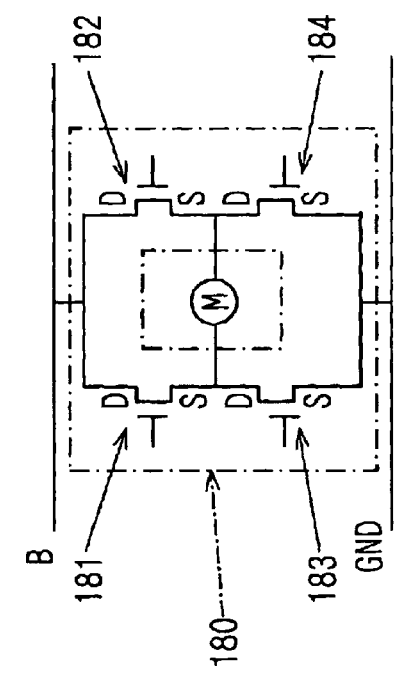
FIG. 11A is a circuit diagram explaining an H-bridge circuit of semiconductor equipment according to a seventh embodiment of the present invention.
Figure 11B:
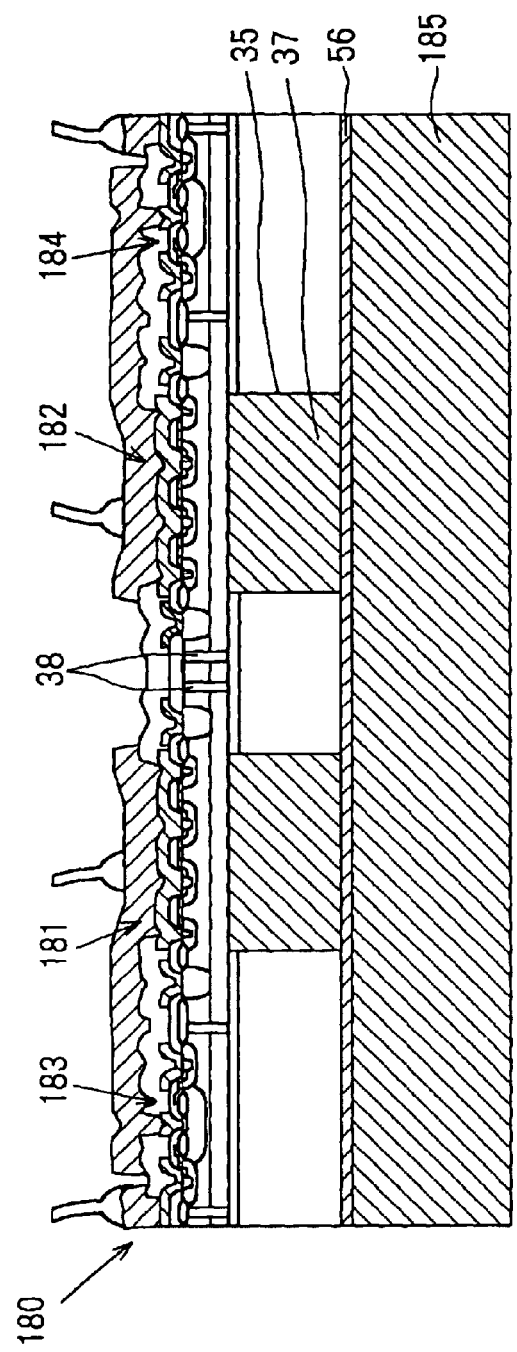
FIG. 11B is a schematic cross-sectional view explaining a mounting configuration of the semiconductor equipment as the H-bridge circuit switch mounted on a heat sink, according to the seventh embodiment.

FIG. 11A is a circuit diagram explaining an H-bridge circuit of semiconductor equipment 180 according to a seventh embodiment of the present invention, and FIG. 11B is a schematic cross-sectional view explaining a mounting configuration of the semiconductor equipment 180 as the H-bridge circuit switch mounted on a heat sink 185.

In the H-bridge circuit, a motor M and four MOS transistors 181–184 are disposed between the electric power source B and the ground GND, and formed to have a H-shape. Each MOS transistor 181–184 provides a switch for an electric current circuit. The motor M is switched between a forward drive and a reverse drive. Two vertical type MOS transistors 181, 182 provide high side switches, respectively. Two lateral type MOS transistors 183, 184 provide low side switches, respectively.

As shown in FIG. 11B, the semiconductor equipment 180 is mounted on a heat sink 185. Each of two MOS transistor 181, 182 has the same structure as the vertical type MOS transistor 111 shown in FIG. 3. Each MOS transistor 181, 182 is isolated and separated by the separator 38 disposed on the principal side of the substrate 30 in the horizontal direction. However, on the rear side of the substrate 30 in the vertical direction, no sidewall insulation film is formed on the sidewall of the trench 35. The metal layer 37 in the trench 35 is connected to the heat sink 185 with a solder 56. Since two MOS transistors 181, 182 are high side switches, the metal layers 37 of the MOS transistors 181, 182 as a drain electrode are connected together, so that a drain circuit D of each switch can be integrated into one drain circuit. Each of two MOS transistors 183, 184 has a L-DMOS structure, so that each transistor 183, 184 provides a low side switch.

Thus, two MOS transistors 181, 182 work as a low ON-state resistance dual-channel high side switch in the H-bridge circuit. Moreover, heat generated in the two MOS transistors 181, 182 conducts through the metal layer 37, which has a high thermal conductivity. Then, the heat is radiated to the heat sink 185. Therefore, thermal radiation of the semiconductor equipment 180 is improved.

(Eighth Embodiment)

Figure 12:
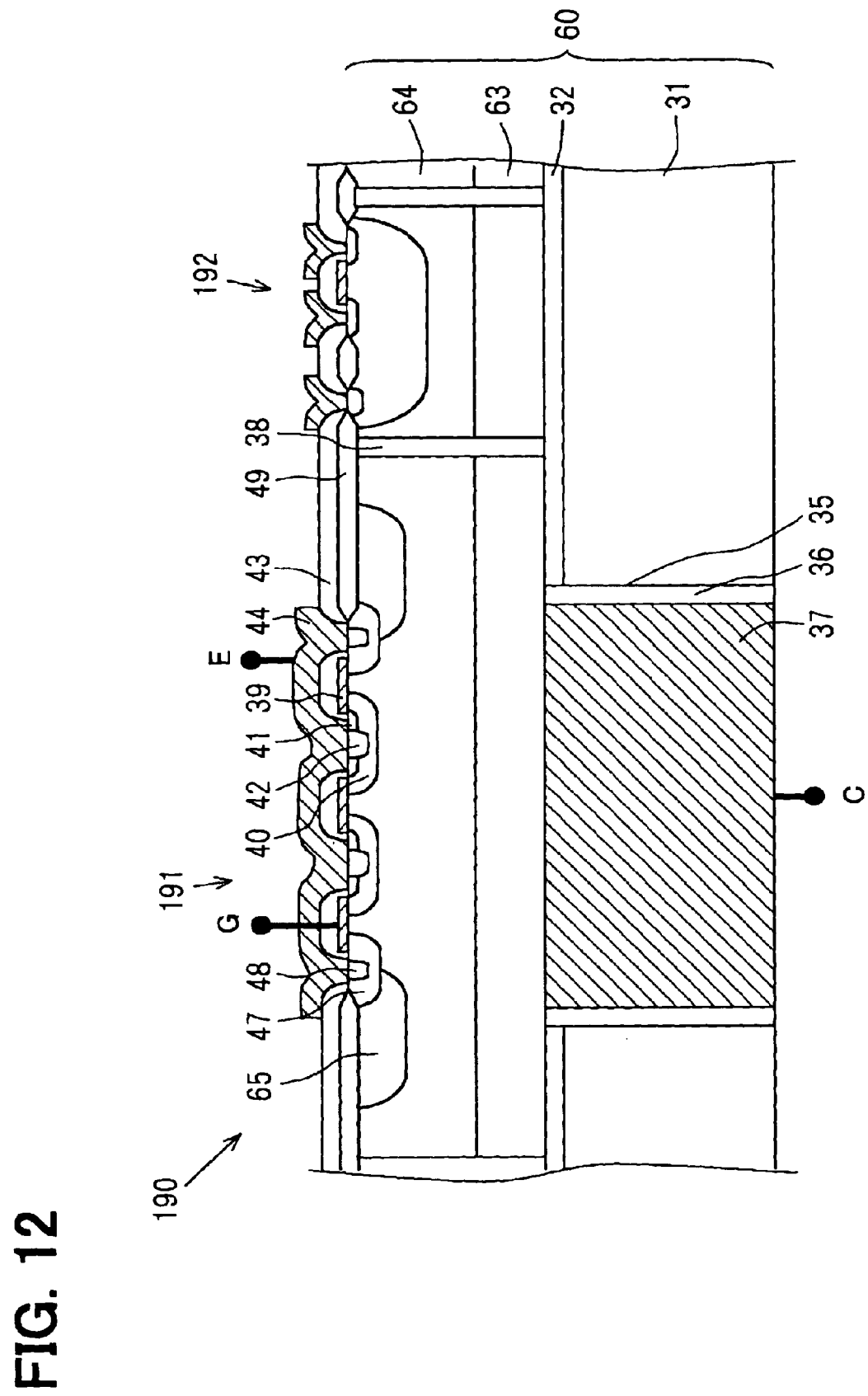
FIG. 12 is a schematic cross-sectional view showing semiconductor equipment according to an eighth embodiment of the present invention.

Semiconductor equipment 190 according to an eighth embodiment of the present invention is shown in FIG. 12. The semiconductor equipment 190 includes a vertical type insulated gate bipolar transistor (i.e., IGBT) 191 and a lateral type MOS transistor 192 formed on a semiconductor substrate 60.

The semiconductor substrate 60 is the SOI substrate with the insulation film 32 embedded therein. The insulation film 32, a $P^+$ type third semiconductor layer 63, and the N type fourth semiconductor layer 64 are stacked on the substrate 31 in this order. The P type diffusion region 40 is formed on a primary side of the fourth semiconductor layer 64. The $N^+$ type diffusion region 41 and the $P^+$ type diffusion region 42 are formed on the surface portion of the diffusion region 40. Outside of the diffusion region 40 in the horizontal direction, the P type diffusion region 47 and the $P^+$ type diffusion region 48 are formed. Further, a $P^+$ type diffusion region 65 is formed outside of the P type diffusion region 47 for relieving an electric field concentrated at an edge of the IGBT 191.

In the IGBT 191, the $P^+$ type third semiconductor layer 63 formed on the principal side with respect to the insulation film 32 corresponds to a collector, the P type diffusion region 40 formed on the surface corresponds to a channel, and the $N^+$ type diffusion region 41 corresponds to an emitter. The P type diffusion region 47 and the $P^+$ type diffusion region 48 relieve an electric field outside the diffusion region 40, so that the withstand voltage of the IGBT 191 is limited to decrease.

The gate electrode 39 is formed on the principal side with respect to the insulation film 32 so as to connect to a part of the diffusion region 40 as the channel through a gate insulation film (not shown). The diffusion regions 41, 42, 48 formed on the principal side commonly connect to the electrode 44 as the emitter electrode E through the interlayer insulation film 43.

The trench 35 is formed on a rear side of the substrate 60 under the third semiconductor layer 63, is disposed perpendicular to the surface, penetrates the insulation film 32, and reaches the third semiconductor layer 63. The sidewall insulation film 36 is formed on the sidewall of the trench 35. The metal layer 37 as a collector electrode C is embedded in the trench 35 so as to contact the third semiconductor layer 63 exposed in the trench 35.

Comparing the vertical type IGBT 191 shown in FIG. 12 to the vertical MOS transistor 101 shown in FIG. 1, the $P^+$ type third semiconductor layer 63 in FIG. 12 is disposed instead of the $N^+$ type first semiconductor layer 33 in FIG. 1. As described before, in the MOS transistor 101, electrons are outputted from the $N^+$ type diffusion region 41 as a source, pass through the diffusion region 40 as a channel and the first semiconductor layer 33 as a drain, and are collected to the metal layer 37 as a drain electrode. On the other hand, in the IGBT 191, not only electrons but also holes work as a carrier. Therefore, the electrons in the IGBT 191 flow similar to those in the vertical MOS transistor 101 shown as arrows in FIG. 1. Moreover, the holes in the IGBT 191 flow in the opposite direction of the electrons.

In the IGBT 191, the trench 35 penetrates the insulation film 32, and reaches the third semiconductor layer 63. The third semiconductor layer 63 is exposed in the trench 35, so that the metal layer 37 as the collector electrode contact the third semiconductor layer 63. Accordingly, in the IGBT 191, current path between the emitter and the collector becomes short, so that the ON-state resistance between the emitter and the collector is reduced.

Although the vertical MOS transistors 101, 111, 121, 131, 141, 151, 161, 162, 171, 172, 181, 182 are used in the semiconductor equipments 100, 110, 120, 130, 140, 150, 160, 170, 180 shown in FIGS. 1–11, the IGBT 191 can be used in the semiconductor equipments 100, 110, 120, 130, 140, 150, 160, 170, 180.

(Ninth Embodiment)

Figure 13:
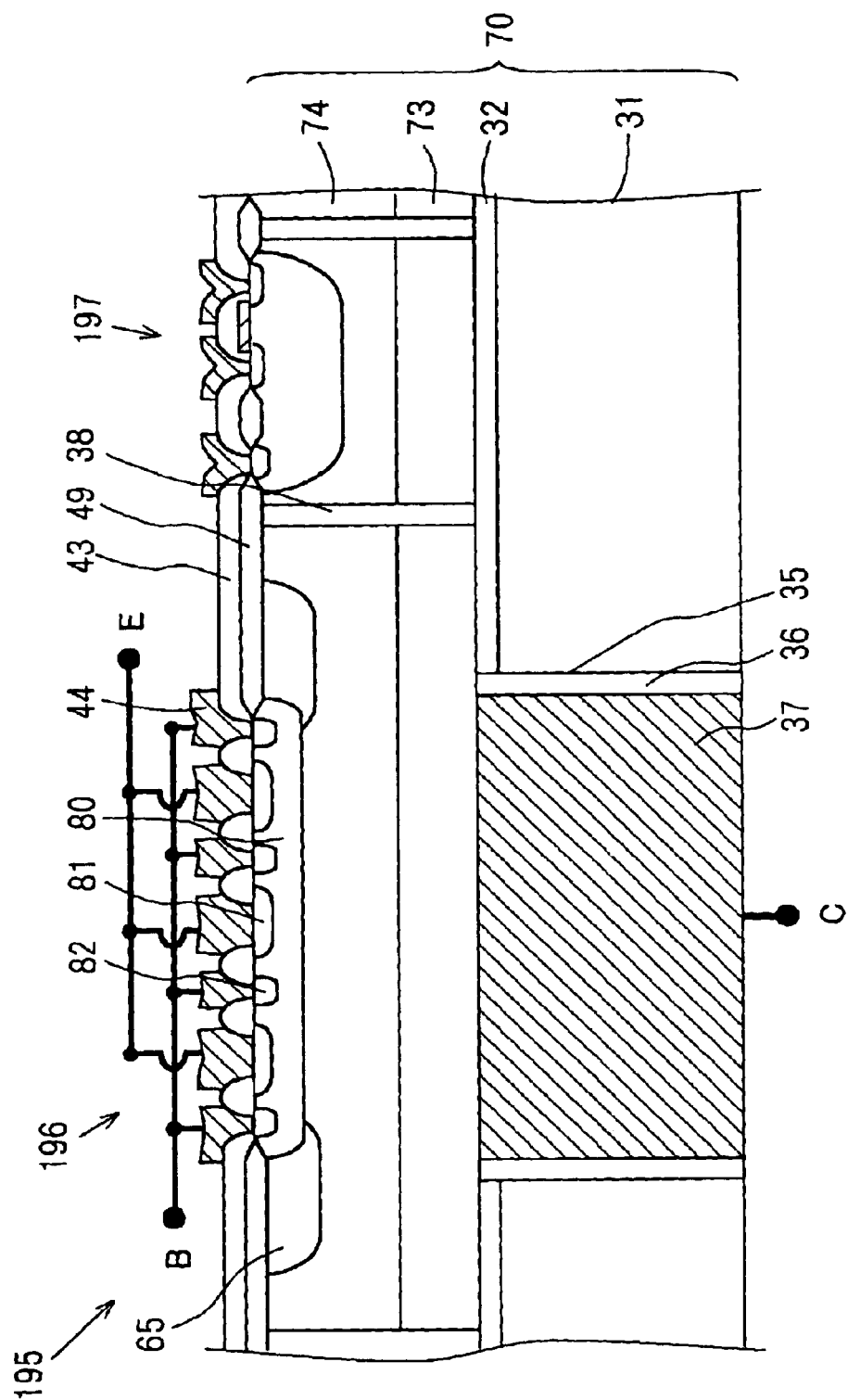
FIG. 13 is a schematic cross-sectional view showing semiconductor equipment according to a ninth embodiment of the present invention.

Semiconductor equipment 195 according to a ninth embodiment of the present invention is shown in FIG. 13. The semiconductor equipment 195 includes a vertical type bipolar transistor 196 and a lateral type MOS transistor 197 formed on a semiconductor substrate 70. The semiconductor substrate 70 is the SOI substrate with the insulation film 32 embedded therein. The insulation film 32, a $N^+$ type fifth semiconductor layer 73, and the N type sixth semiconductor layer 74 are stacked on the substrate 31 in this order.

A P type diffusion region 80 is formed on a primary side of the sixth semiconductor layer 74. An $N^+$ type diffusion region 81 and a $P^+$ type diffusion region 82 are formed on the surface portion of the diffusion region 80. The $P^+$ type diffusion region 65 is formed outside the diffusion region 80 for relieving an electric field concentrated at an edge of the bipolar transistor 196.

The bipolar transistor 196 is a vertical type NPN bipolar transistor. Therefore, the $N^+$ type fifth semiconductor layer 73 formed on the principal side with respect to the insulation film 32 corresponds to a collector, the P type diffusion region 80 formed on the principal side corresponds to a base, and the $N^+$ type diffusion region 81 corresponds to an emitter. The $P^+$ type diffusion region 82 is a base connection diffusion region. Each of the diffusion regions 81, 82 formed on the principal side connects to the electrode 44 through the interlayer insulation film 43, each of which provides the emitter electrode E and the base electrode B, respectively.

The trench 35 is formed on a rear side of the substrate 31 under the fifth semiconductor layer 73, is disposed perpendicular to the surface, penetrates the insulation film 32, and reaches the fifth semiconductor layer 73. The sidewall insulation film 36 is formed on the sidewall of the trench 35. The metal layer 37 as a collector electrode C is embedded in the trench 35 so as to contact the fifth semiconductor layer 73 exposed in the trench 35.

In the vertical type bipolar transistor 196, not only electrons but also holes work as a carrier. Therefore, both of electron current and the hole current flow through the substrate 70 in the vertical direction. The electron current flows opposite to the hole current, i.e., the electrons in the bipolar transistor 196 flow in the opposite direction of the holes.

In the bipolar transistor 196, the trench 35 penetrates the insulation film 32, and reaches the fifth semiconductor layer 73. The fifth semiconductor layer 73 is exposed in the trench 35, so that the metal layer 37 as the collector contact the fifth semiconductor layer 73. Accordingly, in the bipolar transistor 196, current path between the emitter and the collector becomes short, so that the ON-state resistance between the emitter and the collector is reduced.

Although the vertical MOS transistors 101, 111, 121, 131, 141, 151, 161, 162, 171, 172, 181 182 is used in the semiconductor equipments 100, 110, 120, 130, 140, 150, 160, 170, 180 shown in FIGS. 1–11, the vertical type bipolar transistor 196 can be used in the semiconductor equipments 100, 110, 120, 130, 140, 150, 160, 170, 180.

Such changes and modifications are to be understood as being within the scope of the present invention as defined by the appended claims.

What is claimed is:

1. Semiconductor equipment comprising:
   a semiconductor substrate with a semiconductor layer embedded therein having a principal side, a rear side opposite to the principal side, and a trench disposed in the rear side of the substrate; and
   a vertical type transistor having a first electrode disposed in the principal side of the substrate, a second electrode disposed in the rear side, and a diffusion region disposed in the principal side,
   wherein the first electrode connects to the diffusion region through an interlayer insulation film, and
   wherein the second electrode is disposed in the trench and connects to the semiconductor layer exposed in the trench.

2. The semiconductor equipment according to claim 1, wherein the first electrode includes a first metal layer, and the second electrode includes a second metal layer.

3. The semiconductor equipment according to claim 1, wherein the trench has a taper shape.

4. The semiconductor equipment according to claim 1, wherein the trench is filled with the second metal layer.

5. The semiconductor equipment according to claim 1, wherein the vertical type transistor is a metal oxide semiconductor transistor, and
   wherein the first electrode provides a source electrode of the metal oxide semiconductor transistor, and the second electrode provides a drain electrode of the metal oxide semiconductor transistor.

6. The semiconductor equipment according to claim 5, wherein the semiconductor layer includes a first semiconductor layer having a first conductive type and a second semiconductor layer having the first conductive type, the second semiconductor layer being disposed on the first semiconductor layer and having a low dope concentration lower than that of the first semiconductor layer,
   wherein the trench reaches the first semiconductor layer, and
   wherein the metal oxide semiconductor transistor includes a drain provided by the first semiconductor layer, a channel diffusion region having a second conductive type and disposed on a surface portion of the second semiconductor layer, the diffusion region as a source diffusion region having the first conductive type and disposed on a surface portion of the channel diffusion region, and a gate electrode contacting a part of the channel diffusion region through a gate insulation film.

7. The semiconductor equipment according to claim 6, wherein the semiconductor substrate includes a silicon on insulator substrate having an insulation film embedded therein,
   wherein the fist and second semiconductor layers are disposed on the principal side with respect to the insulation film, and
   wherein the trench penetrates the insulation film and reaches the first semiconductor layer.

8. The semiconductor equipment according to claim 7,
wherein the semiconductor substrate further includes a separator for surrounding a main part of the vertical type transistor, and
wherein the separator reaches the insulation film so that the main part of the vertical type transistor is isolated from surroundings by the separator.

9. The semiconductor equipment according to claim 7,
wherein the trench has a sidewall covered with a sidewall insulation film, and
wherein the second metal layer disposed in the trench is isolated from surroundings by the sidewall insulation film.

10. The semiconductor equipment according to claim 6,
wherein the metal oxide semiconductor transistor further includes a drain connection diffusion region having the first conductive type, and
wherein the drain connection diffusion region is disposed from a principal side surface of the second semiconductor layer to the first semiconductor layer so as to contact the first semiconductor layer.

11. The semiconductor equipment according to claim 6,
wherein the gate electrode penetrates the channel diffusion region, and reaches the second semiconductor layer.

12. The semiconductor equipment according to claim 1,
wherein the vertical type transistor is an insulated gate bipolar transistor, and
wherein the first electrode provides an emitter electrode of the insulated gate bipolar transistor, and the second electrode provides a collector electrode of the insulated gate bipolar transistor.

13. The semiconductor equipment according to claim 12,
wherein the semiconductor layer includes a third semiconductor layer having a second conductive type, and a fourth semiconductor layer having the first conductive type and disposed on the third semiconductor layer, and
wherein the insulated gate bipolar transistor includes a collector provided by the third semiconductor layer, a channel diffusion region having the second conductive type and disposed on a surface portion of the fourth semiconductor layer, the diffusion region as an emitter diffusion region having the first conductive type and disposed on a surface portion of the channel diffusion region, and a gate electrode contacting a part of the channel diffusion region through a gate insulation film.

14. The semiconductor equipment according to claim 13,
wherein the semiconductor substrate includes a silicon on insulator substrate having an insulation film embedded therein,
wherein the third and fourth semiconductor layers are disposed on the principal side with respect to the insulation film, and
wherein the trench penetrates the insulation film, and reaches the third semiconductor layer.

15. The semiconductor equipment according to claim 13,
wherein the insulated gate bipolar transistor further includes a collector connection diffusion region having the second conductive type, and
wherein the collector connection diffusion region is disposed from a principal side surface of the second semiconductor layer to the third semiconductor layer so as to contact the third semiconductor layer.

16. The semiconductor equipment according to claim 13,
wherein the gate electrode penetrates the channel diffusion region, and reaches the fourth semiconductor layer.

17. The semiconductor equipment according to claim 1,
wherein the vertical type transistor is a bipolar transistor, and
wherein the first electrode provides an emitter electrode of the bipolar transistor, and the second electrode provides a collector electrode of the bipolar transistor.

18. The semiconductor equipment according to claim 17,
wherein the semiconductor layer includes a fifth semiconductor layer having the first conductive type and a sixth semiconductor layer having the first conductive type, the sixth semiconductor layer being disposed on the fifth semiconductor layer and having a low dope density lower than that of the fifth semiconductor layer, and
wherein the bipolar transistor includes a collector provided by the fifth semiconductor layer, a base diffusion region having the second conductive type and disposed on a surface portion of the sixth semiconductor layer, the diffusion region as an emitter diffusion region having the first conductive type and disposed on a surface portion of the base diffusion region, a base connection diffusion region having the second conductive type, disposed on a surface portion of the base diffusion region and having a low dope density lower than that of the base diffusion region, and a base electrode provided by the first electrode.

19. The semiconductor equipment according to claim 18,
wherein the semiconductor substrate includes a silicon on insulator substrate having an insulation film embedded therein,
wherein the fifth and sixth semiconductor layers are disposed on the principal side with respect to the insulation film, and
wherein the trench penetrates the insulation film, and reaches the fifth semiconductor layer.

20. The semiconductor equipment according to claim 18,
wherein the bipolar transistor further includes a collector connection diffusion region having the first conductive type, and
wherein the collector connection diffusion region is disposed from a principal side surface of the sixth semiconductor layer to the fifth semiconductor layer so as to contact the fifth semiconductor layer.

21. The semiconductor equipment according to claim 1,
wherein the semiconductor equipment is mounted on a printed circuit board by a flip chip mounting method in such a manner that the principal side of the substrate faces the printed circuit board.

22. The semiconductor equipment according to claim 1,
wherein the second metal layer is connected to a heat sink with solder.

23. The semiconductor equipment according to claim 1,
wherein the semiconductor equipment is mounted in a multi-layer printed circuit board in such a manner that the semiconductor equipment is embedded in the multi-layer printed circuit board.

24. The semiconductor equipment according to claim 1,
wherein the vertical type transistor includes a plurality of transistors for providing a multi-channel switch.

25. The semiconductor equipment according to claim 24,
wherein the multi-channel switch further includes an electric load impedance, and wherein a plurality of transistors and the electric load impedance are disposed between a power source and a ground for providing a high side switch, in which the vertical type transistor is disposed on a power source side and the electric load impedance is disposed on a ground side.

26. The semiconductor equipment according to claim 24,
wherein the multi-channel switch is used for a H-bridge circuit for driving an electric load impedance.

27. Semiconductor equipment comprising:

a semiconductor substrate provided by a silicon on insulator substrate having an insulation film embedded therein; and a metal oxide semiconductor transistor disposed on the semiconductor substrate, wherein the semiconductor substrate includes a first semiconductor layer and a second semiconductor layer, which are disposed on a principal side of the substrate with respect to the insulation film, wherein the first semiconductor layer has a first conductive type for providing a drain of the metal oxide semiconductor transistor, wherein the second semiconductor layer has the first conductive type, is disposed on the first semiconductor layer, and has a low dope density lower than that of the first semiconductor layer, wherein the metal oxide semiconductor transistor includes a channel diffusion region, a source diffusion region, and a gate electrode, wherein the channel diffusion region has a second conductive type, and is disposed on a surface portion of the second semiconductor layer, wherein the source diffusion region has the first conductive type, and is disposed on a surface portion of the channel diffusion region, wherein the gate electrode contacts a part of the channel diffusion region through a gate insulation film, wherein the semiconductor substrate further includes a trench and a metal layer, wherein the trench is disposed on a rear side of the substrate opposite to the principal side, is disposed from a rear surface of the substrate, penetrates the insulation film, and reaches the first semiconductor layer, and wherein the metal layer as an electrode is disposed in the trench and contacts the first semiconductor layer.

* * * * *